US012560640B2

(12) United States Patent
Shang et al.

(10) Patent No.: US 12,560,640 B2
(45) Date of Patent: Feb. 24, 2026

(54) METHOD, APPARATUS, AND NON-TRANSITORY COMPUTER MEDIUM FOR DETECTING DEFECTS OF A DEVICE UNDER TEST USING TIME-DOMAIN REFLECTOMETRY

(71) Applicant: ADVANTEST CORPORATION, Tokyo (JP)

(72) Inventors: Yang Shang, Singapore (SG); Masaichi Hashimoto, Miyagi (JP); Makoto Shinohara, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 178 days.

(21) Appl. No.: 18/355,395

(22) Filed: Jul. 19, 2023

(65) Prior Publication Data

US 2025/0027982 A1 Jan. 23, 2025

(51) Int. Cl.
*G01R 31/11* (2006.01)
*A23B 2/00* (2025.01)
(Continued)

(52) U.S. Cl.
CPC .............. *G01R 31/11* (2013.01); *A23B 2/001* (2025.01); *A23B 2/205* (2025.01); *B65B 55/02* (2013.01); *B65B 2210/06* (2013.01)

(58) Field of Classification Search
CPC ......... G01R 31/11; A23B 2/001; A23B 2/205; B65B 2210/06; B65B 55/02
(Continued)

(56) References Cited

U.S. PATENT DOCUMENTS

| 7,139,668 B2 | 11/2006 | Bechhoefer |
| 7,512,503 B2 | 3/2009 | Bechhoefer |

(Continued)

FOREIGN PATENT DOCUMENTS

| CN | 103776480 B | 9/2016 |
| CN | 103646013 B | 1/2017 |

(Continued)

OTHER PUBLICATIONS

Yang Shang et al., "Open-short Normalization Method for a Quick Defect Identification in Branched Traces with High-resolution Time-domain Reflectometry", 2021 IEEE International Test Conference (ITC), pp. 233-242, Nov. 24, 2021.
(Continued)

*Primary Examiner* — Raul J Rios Russo

(57) ABSTRACT

A method, apparatus, and/or system for soft defects modeling of measurements using time-domain reflectometry. Electro-Optic Sampling based Time-Domain Reflectometry (EOS-TDR) may quickly detect soft defects in a chip under test. For example, EOS-TDR may detect soft defects in each pin from a trace-structure point at a relatively high resolution. To interpret the results in a time sensitive manner, a reference model for chips may be established from chips that are known to have met the expected quality standards. Through automated analysis of the features of the device under test waveform, soft defects of a chip may be detected that would be otherwise undetectable under time constraints, temperature variations, applied current variations, applied voltage variations, vibration variations, moisture variations, or any other kind of possible variation.

20 Claims, 16 Drawing Sheets

Figure 1:
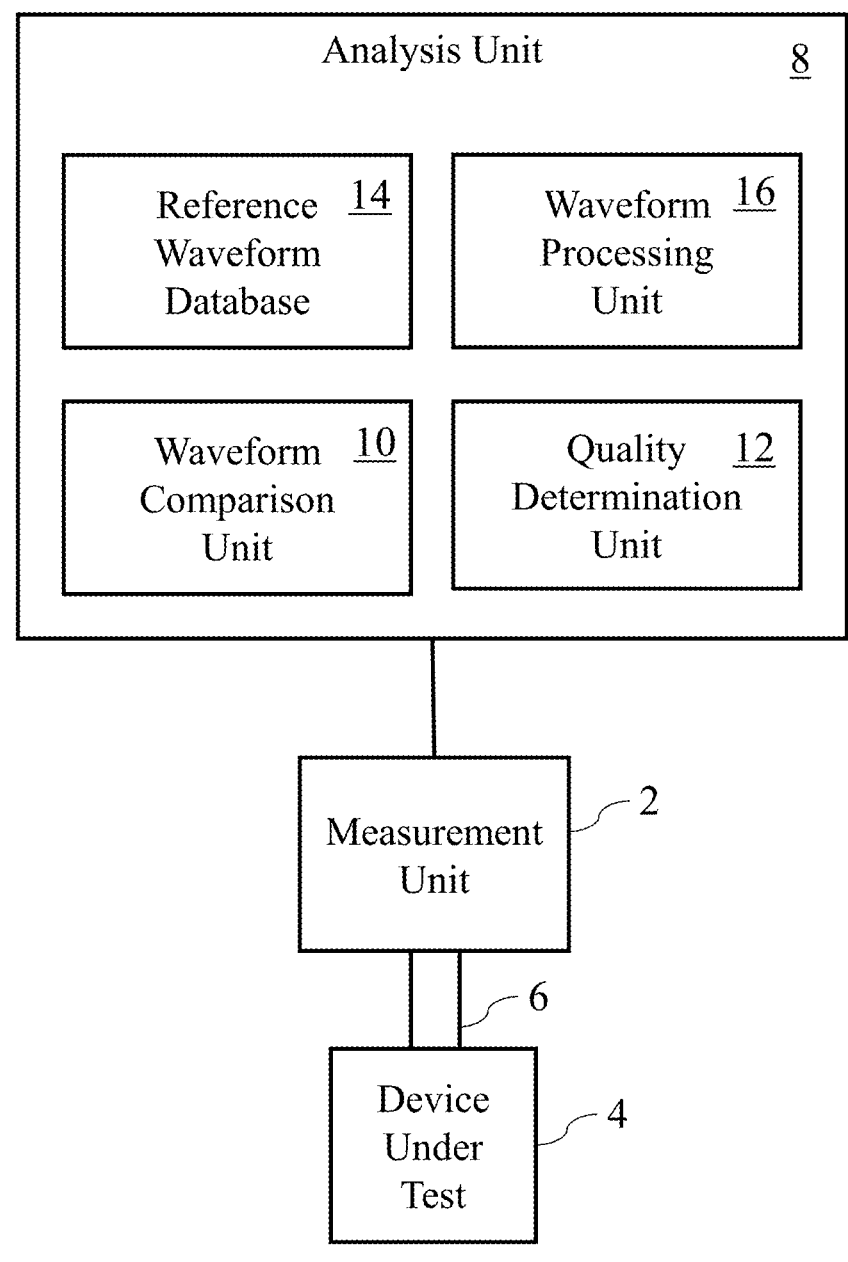

(51) Int. Cl.
*A23B 2/20* (2025.01)
*B65B 55/02* (2006.01)

(58) Field of Classification Search
USPC .......................................................... 324/533
See application file for complete search history.

(56) References Cited

U.S. PATENT DOCUMENTS

| | | | | |
|---|---|---|---|---|
| 2003/0125893 A1* | 7/2003 | Furse | ..................... | G01R 31/58 |
| | | | | 702/108 |
| 2003/0208734 A1* | 11/2003 | Coelho, Jr. | ...... | G01R 31/31937 |
| | | | | 716/136 |
| 2004/0059971 A1* | 3/2004 | Cowan | ............... | G01R 31/2834 |
| | | | | 714/724 |
| 2007/0091297 A1* | 4/2007 | Beller | ................ | G01M 11/3109 |
| | | | | 356/73.1 |
| 2009/0259428 A1* | 10/2009 | Schroth | .............. | G01R 31/3183 |
| | | | | 702/108 |
| 2017/0176511 A1 | 6/2017 | Moell | | |
| 2021/0088582 A1* | 3/2021 | Ravikumar | ......... | G01R 31/311 |

FOREIGN PATENT DOCUMENTS

| | | |
|---|---|---|
| CN | 106896298 B | 11/2021 |
| JP | 2023028758 A | 3/2023 |
| WO | 2020221618 A1 | 11/2020 |

OTHER PUBLICATIONS

Vivek Kumar et al., "Fault Detection Technique by using OTDR: Limitations and drawbacks on practical approach of measurement", International Journal of Emerging Technology and Advanced Engineering, vol. 2, Issue 6, Jun. 2012, pp. 283-287.

Soumaya Sallem et al., "Self adaptive Correlation Method for Soft Defect Detection in cable by Reflectometry", Sensors, 2014 IEEE, Dec. 15, 2014.

* cited by examiner

METHOD, APPARATUS, AND NON-TRANSITORY COMPUTER MEDIUM FOR DETECTING DEFECTS OF A DEVICE UNDER TEST USING TIME-DOMAIN REFLECTOMETRY

BACKGROUND

In certain applications, such as chip manufacturing, defects may not be practically detected during the various stages of the manufacturing process. Soft defects, which affect the long-term sustainability of a chip, are particularly important to detect for chips implemented in certain industries, for example the automotive industry, where the long-term dependability of the chips is necessary for the entire expected life of the ultimate product.

SUMMARY

Embodiments relate to a method of determining if a device under test satisfies quality standards. The method includes measuring the device under test using at least one time-domain reflectometry measurement of the device under test to generate a device under test waveform. The method includes comparing the device under test waveform with at least one reference waveform. The at least one reference waveform represents at least one time-domain reflectometry measurement of at least one device that is known to satisfy quality standards. The method includes determining if the device under test satisfies quality standards based on the result of the comparing.

Embodiments relate to an apparatus for determining if a device under test satisfies quality standards. The apparatus includes a measurement unit configured to measure a device under test using at least one time-domain reflectometry measurement of the device under test to generate a device under test waveform. The apparatus includes a comparison unit configured to compare the device under test waveform with at least one reference waveform. The at least one reference waveform represents at least one time-domain reflectometry measurement of at least one device that is known to satisfy quality standards. The apparatus includes a determination unit configured to determine if the device under test satisfies quality standards based on the result of the comparing.

DRAWINGS

Example FIG. 1 illustrates a system for determining if a device under test (DUT) satisfies quality standards, in accordance with embodiments.

Figure 2:
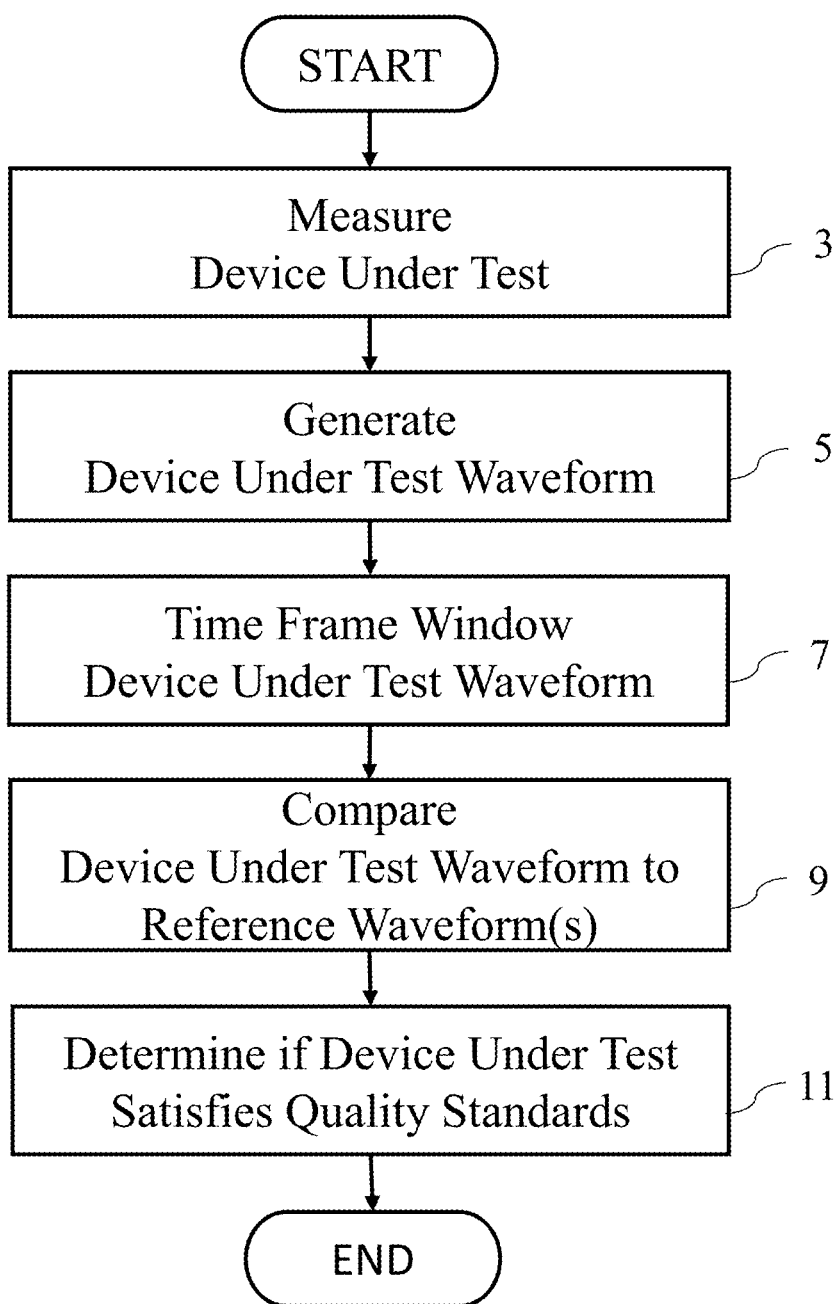

Example FIG. 2 illustrates a method implemented by a system for determining if a device under test (DUT) satisfies quality standards, in accordance with embodiments.

Figure 3:
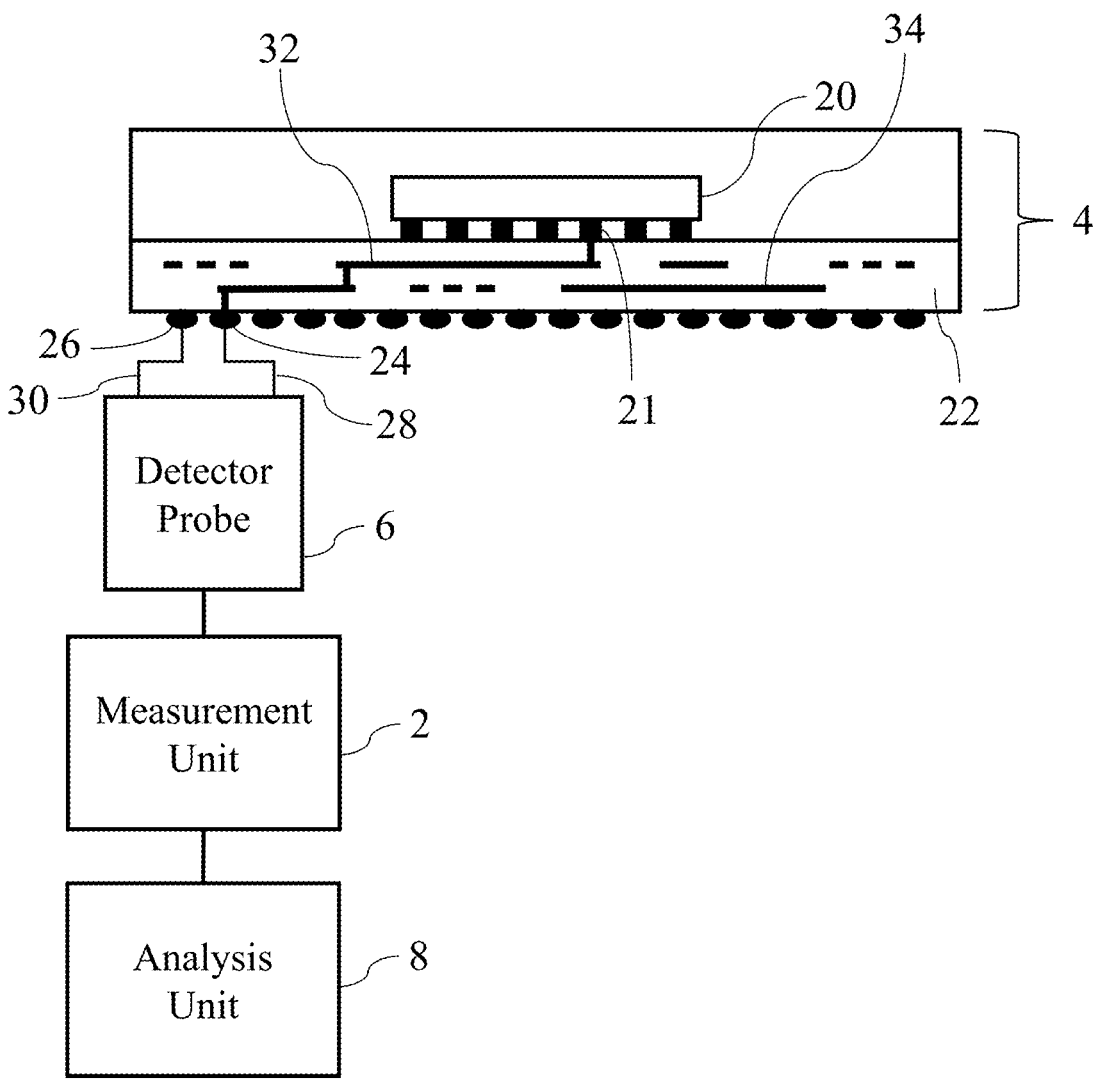

Example FIG. 3 illustrates a device under test (DUT) connected to a system for determining if the DUT satisfies quality standards, in accordance with embodiments.

Figure 4:
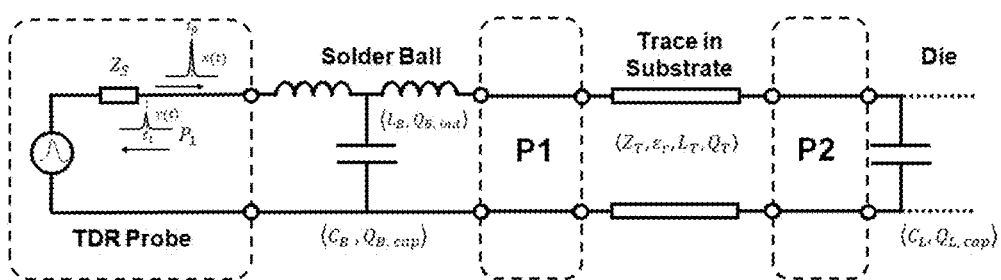

Example FIG. 4 illustrates a circuit representation of the connection between a device under test and a system for determining if a device under test satisfies quality standards, in accordance with embodiments.

Figure 5:
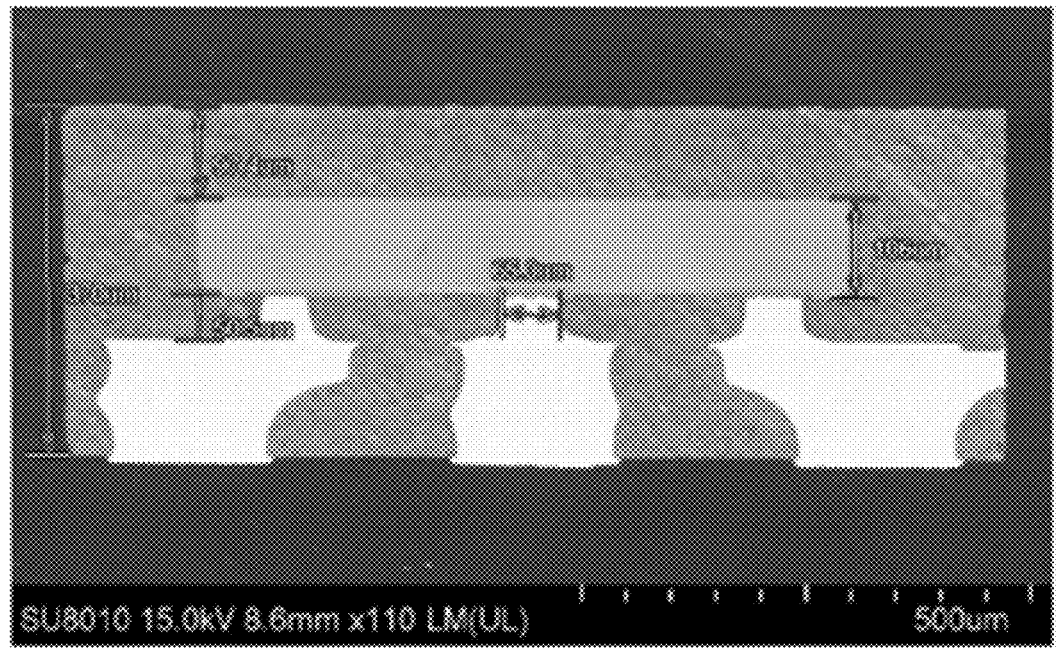

Example FIG. 5 is an example image of a computing chip as an example device under test (DUT), in accordance with embodiments.

Figure 6:
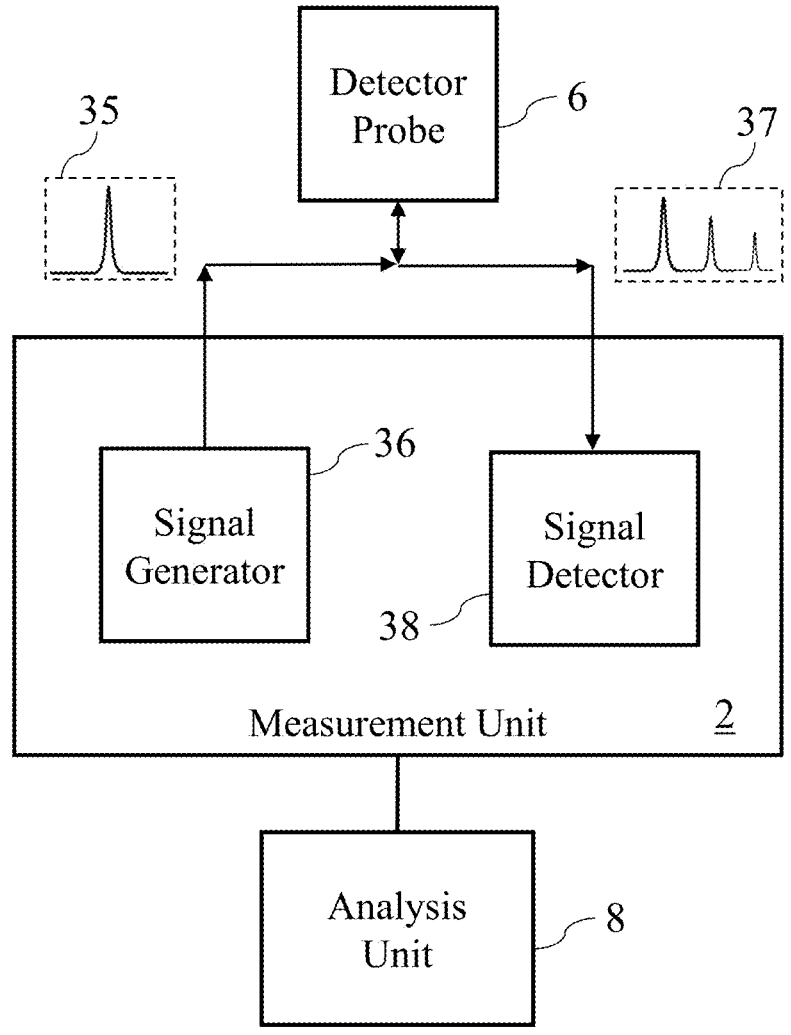

Example FIG. 6 illustrates a measurement unit of a system for determining if a device under test (DUT) satisfies quality standards, in accordance with embodiments.

Figure 7:
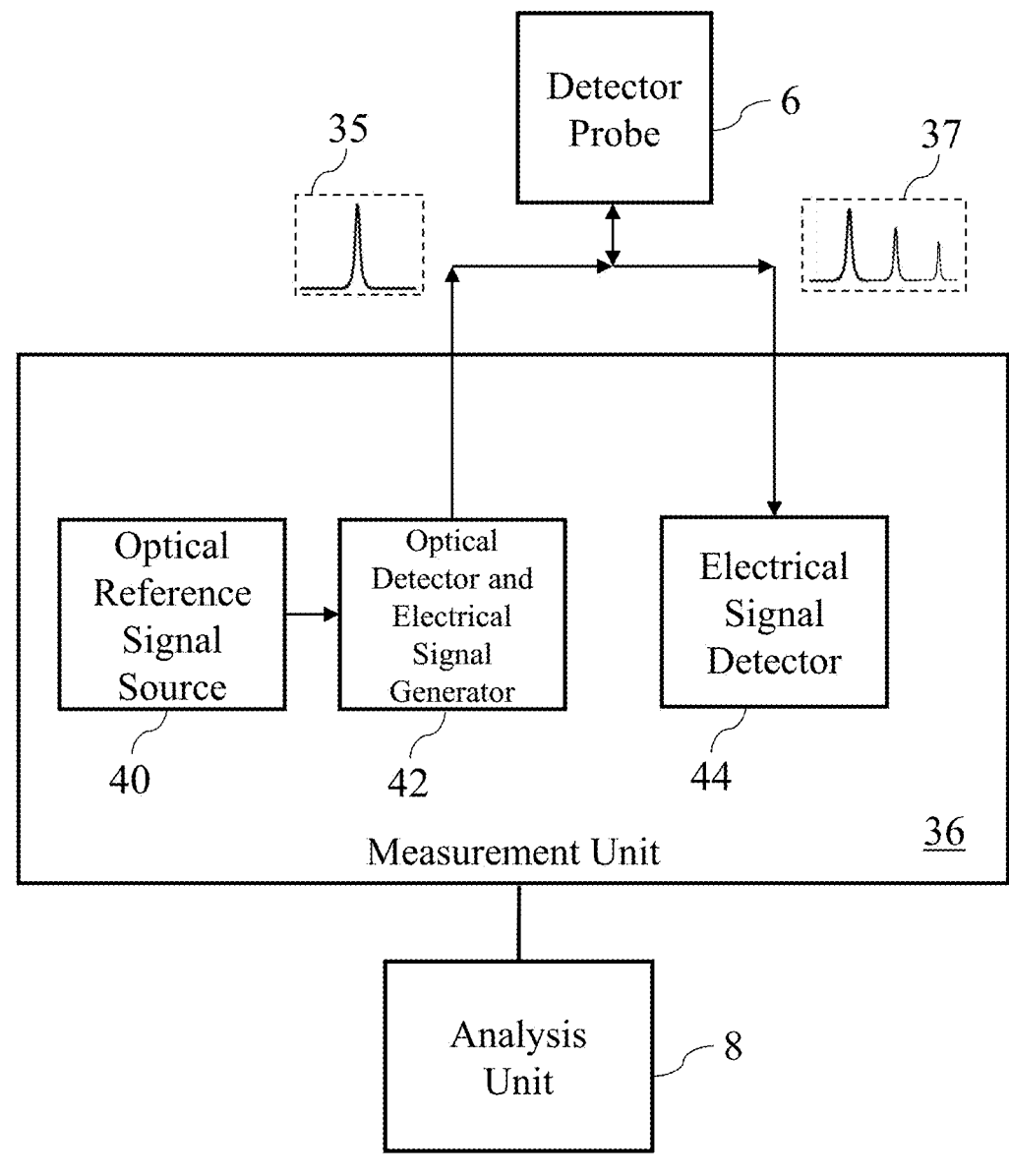
Figure 8:
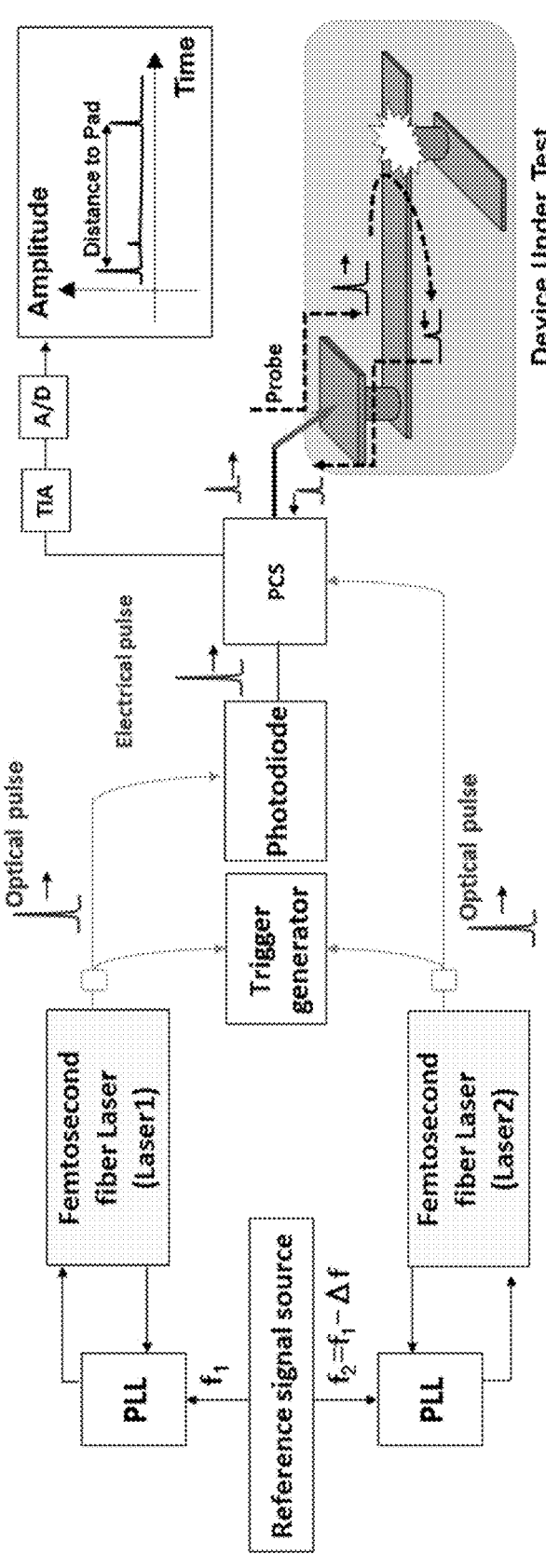

Example FIGS. 7 and 8 each illustrate an example measurement unit of a system for determining if a device under test (DUT) satisfies quality standards that utilizes electro-optic sampling based time-domain reflectometry (EOS-TDR), in accordance with embodiments.

Figure 9:
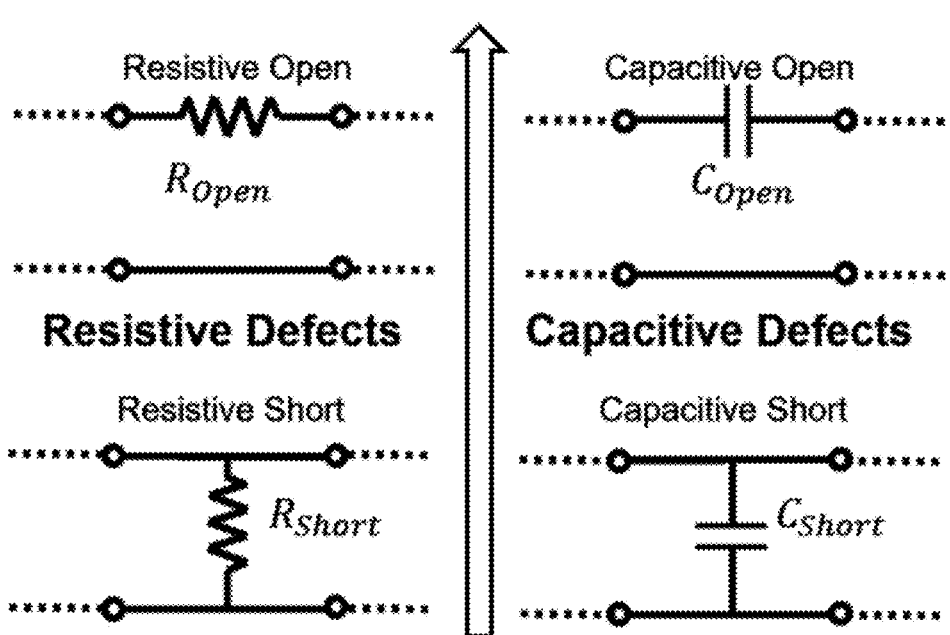

Example FIG. 9 illustrates example types of soft defects in computing chip that may be a device under test (DUT), including resistive defects and capacitive defects, in accordance with embodiments.

Figure 10A:
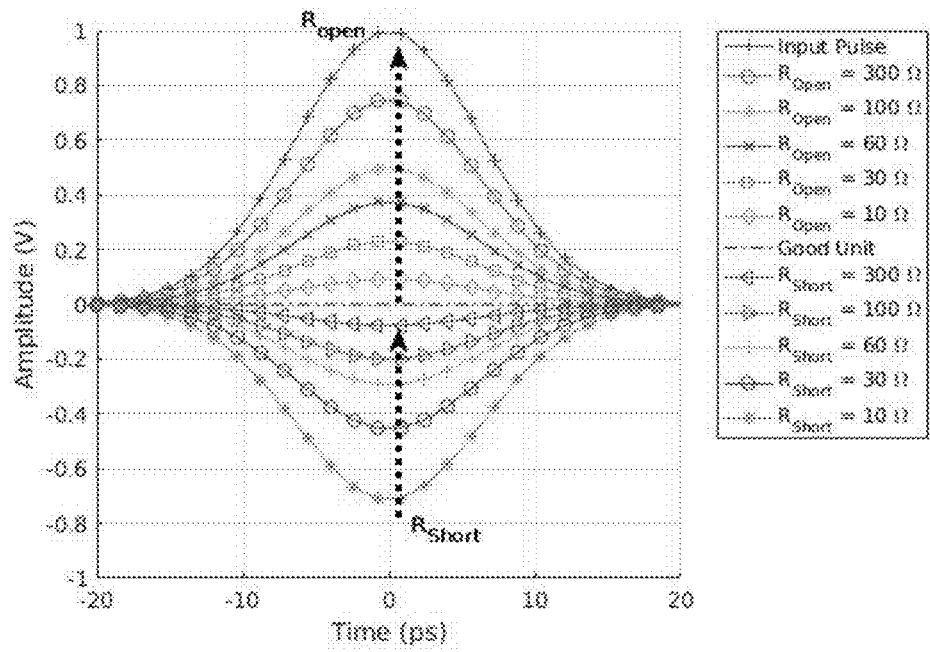
Figure 10B:
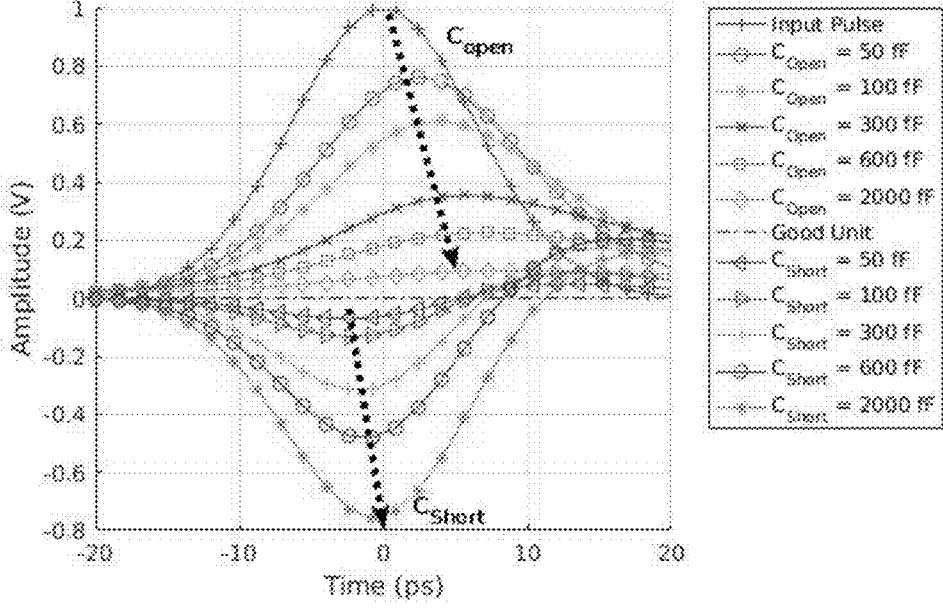

Example FIGS. 10A and 10B illustrate example electro-optic sampling based time-domain reflectometry (EOS-TDR) responses to resistive defects (FIG. 10A) and capacitive defects (FIG. 10B), in accordance with embodiments.

Figure 11:
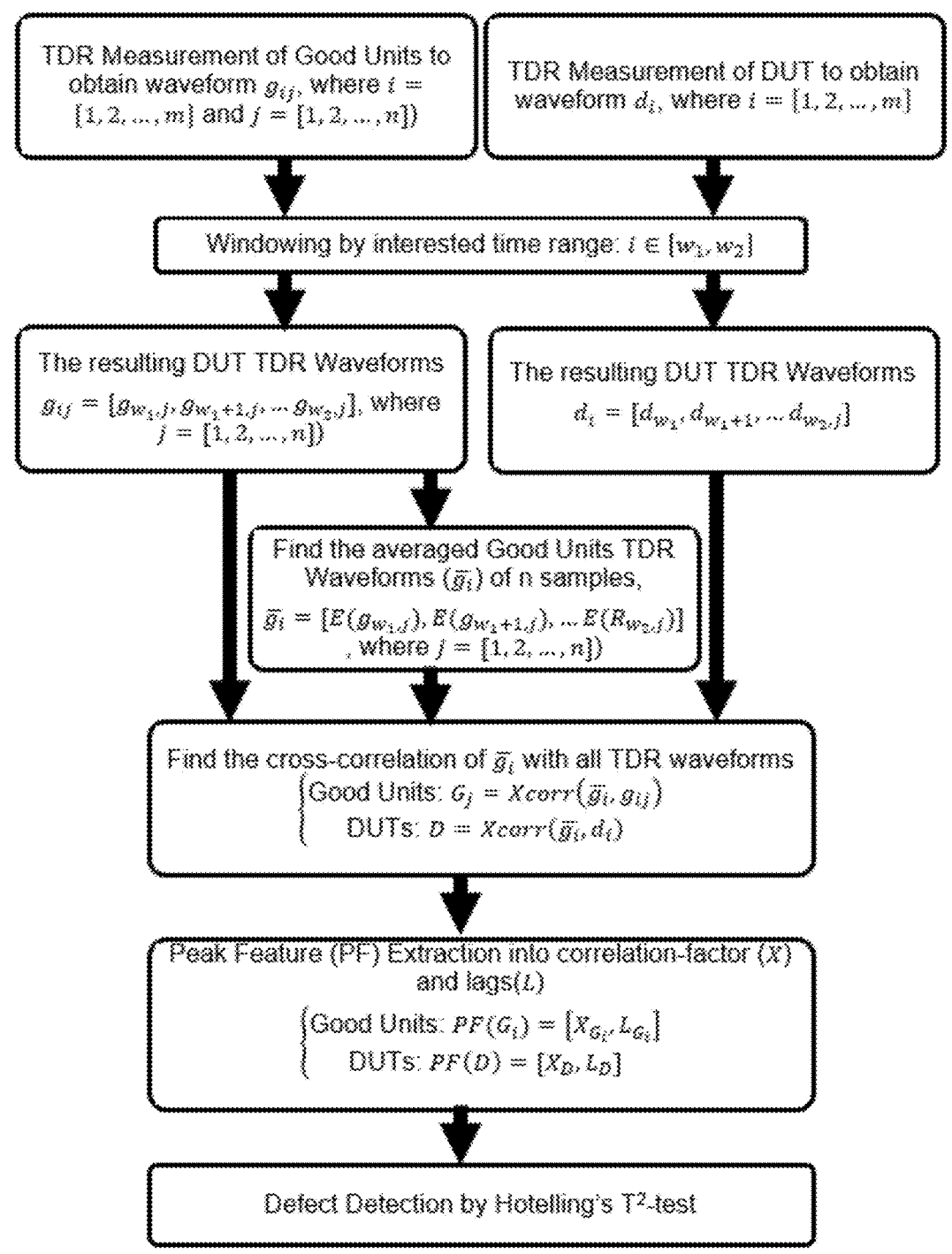

Example FIG. 11 illustrates an example cross-correlation based detection method using electro-optic sampling based time-domain reflectometry (EOS-TDR), in accordance with embodiments.

Example FIGS. 12A, 12B, 12C, and 12D illustrate example device under test waveforms, in accordance with embodiments.

Figure 13:
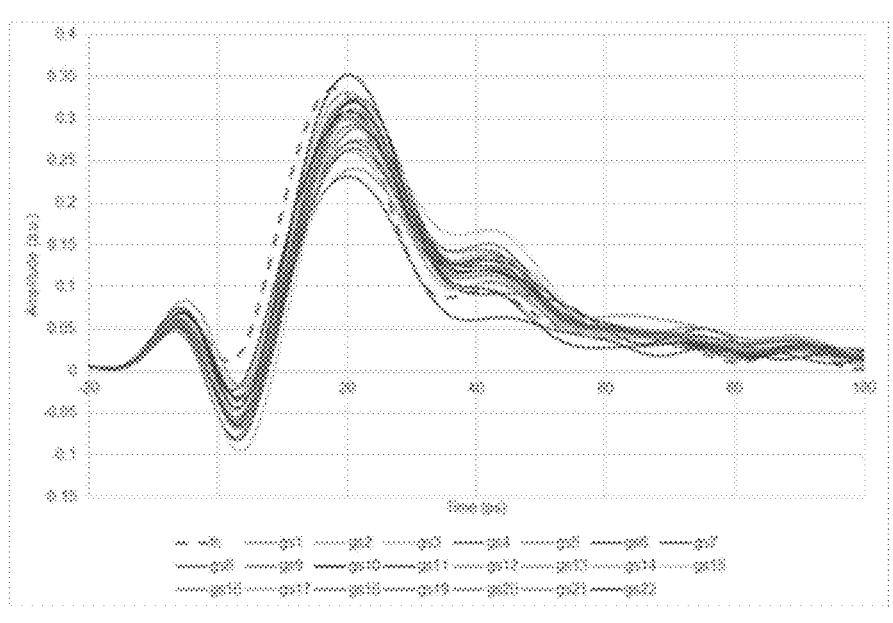

Example FIG. 13 illustrates a representation of a device under test waveform together with reference waveforms, in accordance with embodiments.

Figure 14:
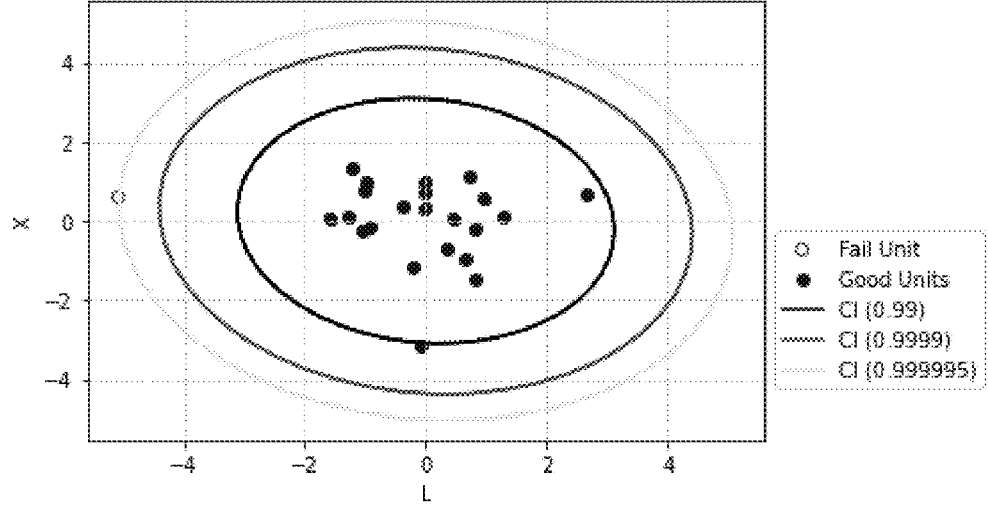

Example FIG. 14 illustrates a visual representation of a Hoteling's T2-test statistical analysis of a device under test waveform of a device under test that fails to satisfy quality standards together with reference waveforms, in accordance with embodiments.

Figure 15:
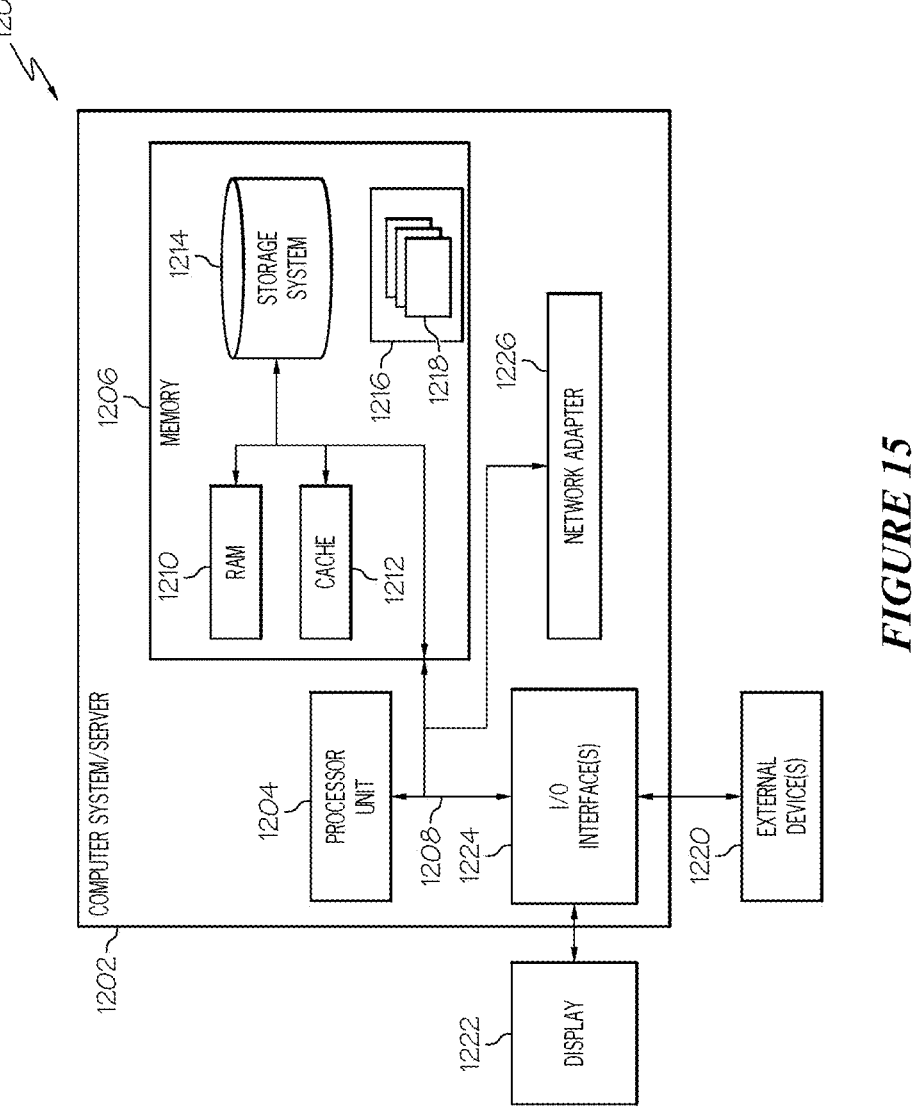

Example FIG. 15 illustrates a computing device, in accordance with embodiments.

Figure 16:
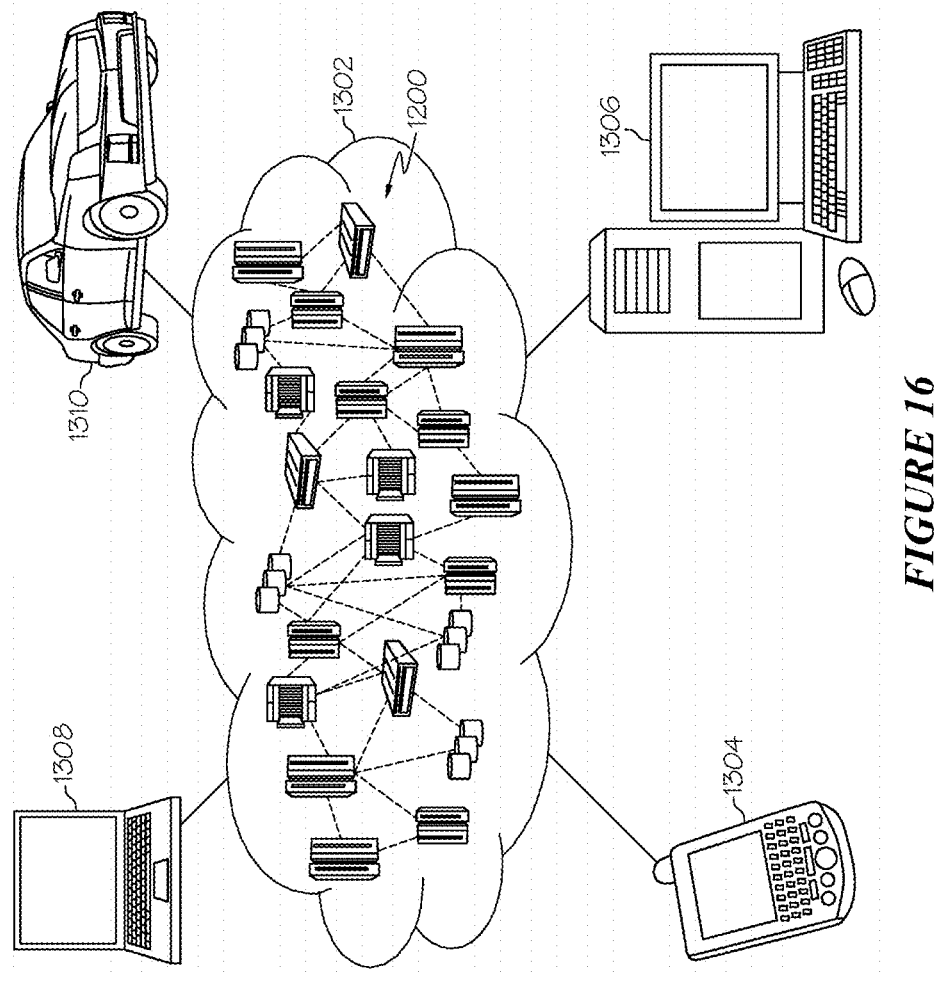

Example FIG. 16 illustrates a cloud computing environment, in accordance with embodiments.

Figure 17:
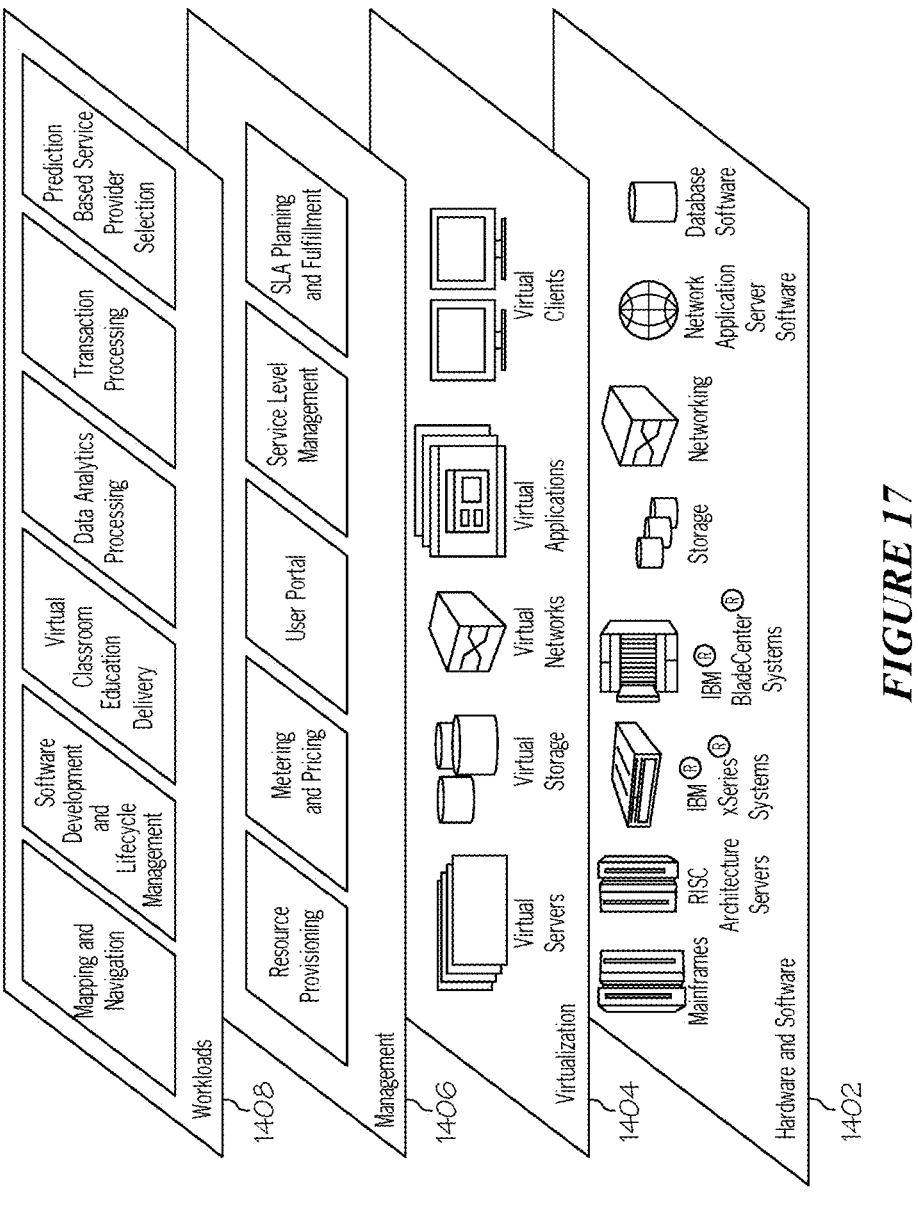

Example FIG. 17 illustrates abstraction model layers, in accordance with embodiments.

DESCRIPTION

Embodiments relate to package-level soft defect detection methods, modelling soft defects in the chip package, and/or detecting soft defects through processing measured electro-optic sampling based time-domain reflectometry (EOS-TDR) waveforms by an outlier detection scheme. Embodiments are focused on efficiency and versatility of detecting different soft defect types and locations of soft defects as well as hard defects. In embodiments, EOS-TDR enable quick early detection of soft defects that may not be detected using functional testing. Embodiments are particularly important in the automotive industry, but are applicable among a wide range of other industries.

Example FIG. 1 illustrates a system for determining if a device under test (DUT) 4 satisfies quality standards, in accordance with embodiments. The system may include an analysis unit 8 and a measurement unit 2.

A measurement unit 2 may be configured to measure a device under test 4 using at least one time-domain reflectometry measurement of the device under test 4 to generate a device under test waveform 37. Measurement unit 2 may contact the device under test 4 using a probe 6.

Analysis unit 8 may include a waveform comparison unit 10 configured to compare the device under test waveform 37 with at least one reference waveform. At least one reference waveform may be stored in a reference waveform database 14. The at least one reference waveform represents at least one time-domain reflectometry measurement of at least one device that is known to satisfy quality standards. The analysis unit 8 may include a quality determination unit 12 configured to determine if the device under test 4 satisfies quality standards based on the result of the comparing. The analysis unit 8 may include a waveform processing unit 16 configured to process waveforms measured by the measurement unit 2 or stored in the reference waveform database 14.

Example FIG. 2 illustrates a method implemented by a system for determining if a device under test (DUT) 4 satisfies quality standards, in accordance with embodiments. In the method, step 3 measures a device under test 4 using at least one time-domain reflectometry measurement of the device under test 4. Step 5 generates a device under test waveform. Step 9 compares a device under test waveform with at least one reference waveform. Reference waveforms represent at least one time-domain reflectometry measurement of at least one device that is known to satisfy quality standards. Step 11 determines if the device under test 4 satisfies quality standards based on the result of the comparing step 9.

In embodiments, each of the associated reference waveforms is time frame windowed to a relevant time range prior to the generating an average reference waveform from a plurality of associated reference waveforms. The time frame windowing of the associated reference waveforms may be performed either before or after storage of the reference waveforms to the reference waveform database 14, in accordance with embodiments.

In embodiments, in step 7, the device under test waveform is time frame windowed to the relevant time range prior to the comparing (e.g., step 9) the device under test waveform 4 with the associated reference waveforms.

In embodiments, a relevant time range of the device under test waveform and/or the associated reference waveforms are selected to include at least one peak feature of at least one of the associated reference waveforms.

Example FIG. 3 illustrates a device under test (DUT) 4 connected to a system for determining if the DUT 4 satisfies quality standards, in accordance with embodiments. In embodiments, the device under test 4 is a computing chip as shown in example FIG. 3. In embodiments, the quality standards relate to the quality of the wiring 32 in a substrate 22 between probe 6 of the measurement system and die 20 of the computing chip 4. In embodiments, the determining if the device under test 4 satisfies quality standards (e.g., step 11) determines if there are soft defects in the computing chip 4 that cannot be detected by functional testing.

In embodiments, detector probe 6 may use a first lead line 28 to connect to a solder ball 24 that is intended to be electrically connected to the die 20 through wiring 32 and contact 21. In embodiments, it is at least one of solder ball 24, wiring 32, or contact 21 which is being tested in Example FIG. 3. In some embodiments, detector probe 6 may include a second lead line 30 which connects to a solder ball 26 that is grounded to the computing chip 4 and not connected to any wiring.

Example FIG. 4 illustrates a circuit representation of the connection between a device under test 4 and a system for determining if a device under test 4 satisfies quality standards, in accordance with embodiments.

The circuit diagram of example FIG. 4 illustrates a selected signal pin in a flip-chip ball grid array (BGA) packaged chip sample under electro-optic sampling based time-domain reflectometry (EOS-TDR) measurements. The pulse signals are injected into the BGA balls through a radio frequency (RF) probe, then they propagate along the trace in the substrate and reach the die. The pulse signals may be partially reflected if the die-substrate interface is not adequately matched in impedance. For example, some die pads are incorporated with an electrostatic discharge (ESD)

protection with a typical decoupling capacitance in the range of 0.2~2 pF, and negative pulses will be reflected and detected by the EOS-TDR system. In embodiments, soft-open defects in the package may occur anywhere along the trace, such as balls, vias, bumps, or at other elements. For the purposes of illustration, example FIG. 4 illustrates two locations of the selected signal pin, P1 and P2, representing the ball-substrate interface and substrate die interface, respectively.

In embodiments, if the repeatability of a measurement system is well controlled, the soft-defect detection sensitivity is determined by the sample-to-sample variation. The repeatability of a semi-auto probe station may be with ±3 μm. In embodiments, an EOS-TDR system may have a dynamic range above 90 dB and a distance resolution smaller than 5 μm. In embodiments, the sample-to-sample variation is widely influenced by the process and materials in the chip packaging.

TABLE 1

| Section | Parameters | Nominal | | Tolerance |
|---------|-----------|---------|---|-----------|
| Balls | $L_B$ | 300 | pH | ±12.5% |
| | $C_B$ | 100 | fF | ±10% |
| | $Q_{B, ind}, Q_{B, cap}$ | 200 | | ±5% |
| Trace | $Z_T$ | 50 | Ω | ±5% |
| | $\varepsilon_r$ | 3.5 | | ±0.05 |
| | $L_T$ | 3 | mm | ±150 μm |
| | $Q_T$ | 100 | | ±5% |
| Device | $C_L$ | 1 | pF | ±5% |
| | $Q_{L, cap}$ | 10 | | ±5% |

Table 1 illustrates example parameters of each circuit element in FIG. 4 in both nominal values and tolerance, in accordance with embodiments. The BGA ball section may be modelled by series inductance ($L_B$), the quality factor of series inductance ($Q_{B,ind}$), ball-to-ball shunt capacitance ($C_B$), and the quality factor of shunt capacitance ($Q_{B,cap}$). Assuming $L_B$ is proportional to the height of the balls, for a typical BGA ball with 400-μm height and ±50-μm tolerance, the potential inductance tolerance may be ±12.5%, in accordance with embodiments. The trace section may be modelled by a lossy transmission line parameterized by trace length ($L_T$), characteristic impedance ($Z_T$), equivalent relative permittivity ($\varepsilon_r$) and quality factor ($Q_T$). In embodiments, the tolerance of both $L_T$ and $Z_T$ are affected by the etching accuracy of trace layout, whereas that of $Z_T$ may also affected by the $\varepsilon_r$. The device section inside the die may be modeled by an equivalent capacitor in capacitance ($C_L$) and quality factor ($Q_{L,cap}$), in accordance with embodiments. In embodiments, the quality factors of the components inside the die may be lower than the ones outside. For example, $Q_{L,cap}$ may be 10 times smaller than $Q_T$, in some embodiments. A Monte-Carlo method may be used to compare the defective units with the good ones, in accordance with embodiment.

Example FIG. 5 is an example image of a computing chip as an example device under test (DUT), in accordance with embodiments. Example FIG. 4 shows the cross-section view of a chip under test. Each pad is directly connected to the die through a copper pillar. Both the upper and lower surface of copper pillars may be prone to soft open defects.

Example FIG. 6 illustrates measurement unit 2 of a system for determining if a device under test (DUT) 4 satisfies quality standards, in accordance with embodiments. Measurement unit 2 includes a signal generator 36 which may generate a pulse waveform 35, in accordance with embodiments. The pulse waveform 35 may be electrically transmitted to detector probe 6. When detector probe 6 is connected to a device under test 4, the pulse waveform 35 may be internally transmitted through the device under test 4 and reflected in the form of reflected waveform 37. The characteristics and attributes of the reflected waveform 37 will depend on the impedance characteristics of the device under test 4, which may be indicative of whether the device under test 4 satisfies quality standards, in accordance with embodiments. A signal detector 38 may detect the reflected waveform 37 for communication of the characteristics, attributes, or a representation of the reflected waveform 37 to be sent to analysis unit 8.

Example FIG. 7 illustrates an example measurement unit of a system for determining if a device under test (DUT) 4 satisfies quality standards that utilizes electro-optic sampling based time-domain reflectometry (EOS-TDR), in accordance with embodiments. In an EOS-TDR, in accordance with embodiments, an optical reference signal source 40 may generate an optical reference signal with a relatively high resolution. In embodiment, an optical detector and electrical signal generator 42 may receive the optical reference signal and generate a relatively high-resolution electrical signal 35 to be transmitted to detector probe 6. Electrical signal 35 may be reflected internally at a device under test 4 which results in reflected signal 37. Reflected waveform 37 may be detected by electrical signal detector 44.

In embodiment, at least one time-domain reflectometry measurement 37 of the device under test 4 is at least one electro-optic sampling based time-domain reflectometry measurement 37 of the device under test 4. In embodiments, at least one time-domain reflectometry measurement 37 of the at least one device that is known to satisfy quality standards is at least one electro-optic sampling based time-domain reflectometry measurement 37 of the at least one device that is known to satisfy quality standards.

Example FIG. 8 illustrates an example measurement unit of a system for determining if a device under test (DUT) 4 satisfies quality standards that utilizes electro-optic sampling based time-domain reflectometry (EOS-TDR), in accordance with embodiments.

Electro-optic sampling-based time-domain reflectometry (EOS-TDR) may quickly detect the soft defects in each pin from a trace-structure point of view regardless the operation of transistors inside the die. As illustrated in example FIG. 8, similar to an oscilloscope-based time-domain reflectometry system, an electro-optic sampling based time-domain reflectometry (EOS-TDR) system injects electrical impulse waveforms to the device under test and monitors the reflections. In embodiments, an EOS-TDR system may provide a distance resolution that is 20-30 times better than other oscilloscope-based time-domain reflectometry systems, which may be significant in the detection of a minor waveform deviations induced by soft defects along a trace. In embodiments, narrow pulse waves generated by EOS-TDR systems may provide a superior discrimination in the defect location as compared to the step waves from an oscilloscope-based time-domain reflectometry system.

For example, a soft defect, that could only be detected by functional testing under extreme conditions using an oscilloscope-based time-domain reflectometry system, may be detected by a EOS-TDR system under normal conditions (e.g., ambient temperature, no excess stress on the pads, powered off, etc.). For example, if using a functional test, a partial open can only be detected at 70° C., but if measured by EOS-TDR, the waveform deviation compared to devices that are known to satisfy quality standards can be detected at room temperature. Similarly, a via crack occurring at 135° C. may be detected prior to cracking by waveform deviations detected at room temperature. In embodiments, waveform deviations are caused by defects in defective devices and/or sample-to-sample variations among Good Units (e.g., devices that are known to satisfy quality standards). In embodiments, to detect soft defects among numerous devices through EOS-TDR waveforms, an understanding of the waveform deviations from different soft defect situations may be necessary. In embodiments, statistical analysis may be necessary to identify outliers.

Embodiments enable soft defect detection through the analysis of EOS-TDR waveforms. In embodiments, the circuit models of typical soft defects may be generated followed by analysis of the resulting EOS-TDR responses. In embodiments, a cross-correlation based outlier waveform detection method may be implemented to detect a general soft defect.

Example FIG. 9 illustrates example types of soft defects in computing chips that may be a device under test (DUT), including resistive defects and capacitive defects, in accordance with embodiments. Example FIG. 9 illustrates examples of typical soft defects in chip packages, including resistive defects and capacitive defects. Both resistive and capacitive defects may increase or decrease the load impedance. The load impedance may be higher if there are resistive open or capacitive open defects. The load impedance may be lower if there are resistive short or capacitive short defects.

Example FIGS. 10A and 10B illustrate example electro-optic sampling based time-domain reflectometry (EOS-TDR) responses to a resistive defects (FIG. 10A) and capacitive defects (FIG. 10B), in accordance with embodiments.

Example FIG. 10A illustrates a simulated EOS-TDR response to a resistive defect. The reflection peak amplitude increases with the equivalent defect resistance ($R_{Open}$ or $R_{Short}$). In embodiments, the reflection from resistive open is positive, whereas the reflection from resistive short is negative. Since the peak reflection time of resistive defects is independent to $R_{Open}$ and $R_{Short}$, the detection may be realized from the magnitude changes of TDR waveforms.

Example FIG. 10B illustrates a simulated EOS-TDR response to a capacitive defect. Like resistive defects, the reflection from a capacitive open is positive, whereas the reflection from a capacitive short is negative. In embodiment, the reflection peak amplitude decreases with the equivalent defect capacitance ($C_{Open}$ or $C_{Short}$). In embodiments, due the energy storage feature of capacitance, the time delay of a reflection peak increases with $C_{Open}$ and $C_{Short}$. In embodiments, both magnitude and time changes may be considered to detect a capacitive defect.

Example FIG. 11 illustrates an example cross-correlation based detection method using electro-optic sampling based time-domain reflectometry (EOS-TDR), in accordance with embodiments.

In embodiments, there is a plurality of devices that are known to satisfy quality standards. Each of the plurality of devices that are known to satisfy quality standards has an associated reference waveform. In embodiments, a method generates an average reference waveform by averaging all the associated reference waveforms of all the plurality of devices that are known to satisfy quality standards.

In embodiments, cross-correlating of the average reference waveform with each of the associated reference waveforms is performed to generate at least one cross-correlation of the associated reference waveforms. In embodiments, cross-correlating of the average reference waveform with the device under test waveform is performed to generate a cross-correlation of the device under test waveform.

In embodiments, extracting at least one peak feature from the at least one cross-correlation of the associated reference waveforms is performed. In embodiments, extracting at least one peak feature from the cross-correlation of the device under test waveform is performed.

In embodiments, the at least one peak feature from the at least one cross-correlation of the associated reference waveforms includes at least one of an amplitude peak feature of the associated reference waveforms or at least one lag peak feature of the associated reference waveforms. In embodiments, the at least one peak feature from the cross-correlation of the device under test waveform includes at least one of an amplitude peak feature of the device under test waveform or a lag peak feature of the device under test waveform.

In embodiments, a method includes comparing the at least one peak feature extracted from the cross-correlation of the device under test waveform with the at least one peak feature extracted from the cross-correlation of the associated reference waveforms. In embodiments, a significant deviation of the lag peak feature of the device under test waveform compared to the lag peak features of the associated reference waveforms is indicative of a capacitive defect of the device under test.

In embodiments, a method includes comparing the at least one peak feature extracted from the cross-correlation of the device under test waveform with the at least one peak feature extracted from the cross-correlation of the associated reference waveforms. In embodiments, a significant deviation of the amplitude peak feature of the device under test waveform compared to the amplitude peak features of the associated reference waveforms is indicative of a resistive defect of the device under test.

In embodiments, a method includes comparing the at least one peak feature extracted from the cross-correlation of the device under test waveform with the at least one peak feature extracted from the cross-correlation of the associated reference waveforms.

In embodiments, a method includes determining that the device under test does not satisfy quality standards if it is determined that there is a significant deviation of the at least one peak feature extracted from the cross-correlation of the device under test waveform with the at least one peak feature extracted from the cross-correlation of the associated reference waveforms.

In embodiments, it may be determined that there is a significant deviation according to statistical analysis of the at least one peak feature extracted from the cross-correlation of the device under test waveform and the at least one peak feature extracted from the cross-correlation of the associated reference waveforms. In embodiments, the statistical analysis includes Hotelling t-squared statistical analysis. In embodiments, the statistical analysis is performed by at least one of artificial intelligence, machine learning, or a statistical algorithm.

In embodiments, EOS-TDR waveform deviation may be due to a soft-defect that is impedance related and/or location related. For example, if a pulse amplitude of a pulse reflection is impedance related, pulse timing may be location related. Example FIG. 11 illustrates a cross-correlation based soft-defect detection embodiments, which includes time-window identifications, feature extractions, and/or Hoteling's $T^2$-testing. Feature extracted by cross-correlation is relatively sensitive to amplitude changes and time changes, in accordance with embodiments.

In embodiments, EOS-TDR waveforms may include defect-dependent reflections (DDR) and/or defect-independent reflections (DIR). In embodiments, to detect a defect with a known location, the interested time-window may be identified with the help of DDR, which could be obtained by open-short normalization and/or comparing the waveforms of defective unit with the ones of non-defective units (e.g., good units). However, in embodiments, if the defect location is unknown, the time-window may need to cover the reflection time of the furthest device. In embodiments, the same time window will be applied to the EOS-TDR waveforms of both non-defective units and defective units for further calculation.

In embodiments, after windowing, the averaged non-defective units EOS-TDR waveform ($\overline{g}_i$) and the DUT waveform ($d_i$) become equal length vectors, where $i\epsilon[w_1, w_2]$, and $w_1$ and $w_2$ are the left and right boundaries of the time window. The defect induced waveform deviation may be detected by measuring the similarity of $\overline{g}_i$ and $d_i$ by cross-correlation analysis, resulting into the two features of correlation-factors (X) and lags (L). In embodiments, X and L may correspond to defect induced impedance change and time shift change, respectively.

In embodiments, $[X_D, L_D]$ and $[X_{G_i}, L_{G_i}]$, ($i=[1, 2, \ldots, m]$) represent standardized feature vectors extracted from the device under test and Good Units (e.g., devices that are known to meet quality standards or non-defective units, etc.), respectively. Hoteling's $T^2$-test may be done by:

$$T^2 = [X_D, L_D]^T S^{-1} [X_D, L_D]$$

where S is the covariance matrix of $[X_{G_i}, L_{G_i}]$.

In embodiments, when $[X_{G_i}, L_{G_i}]$ follows a chi-squared distribution, the soft-defect detection region may be defined as:

$$T^2 > \chi^2(\alpha, k)$$

where ($1-\alpha$) is the confidence interval, and k is the degree of freedom (e.g., here k equals to 2).

Example FIGS. 12A, 12B, 12C, and 12D illustrate example device under test waveforms, in accordance with embodiments.

Figure 12A:
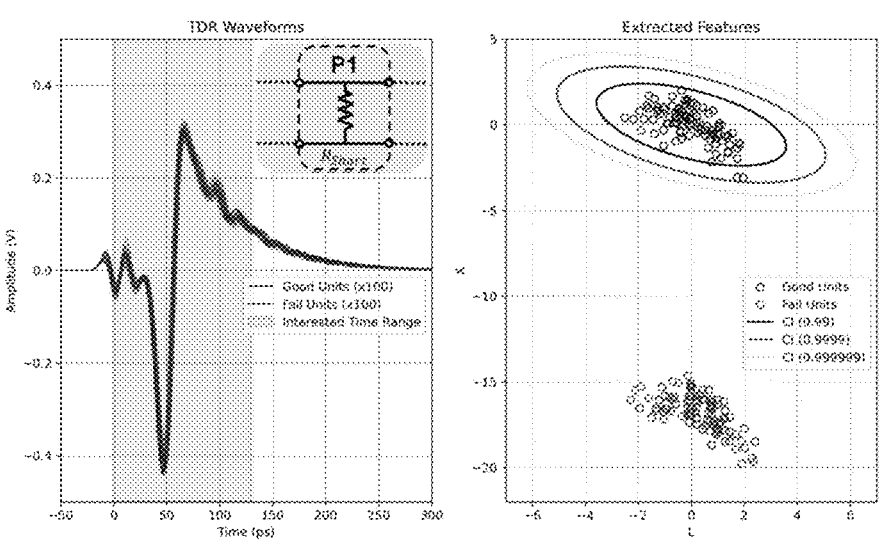

An example resistive short defect illustrated in FIG. 9 may be placed at a P1 location of FIG. 4 with a $R_{Short}$ of 1 k$\Omega$. The TDR waveforms of Fails Units may be simulated through another 100 samples (for example) generated with the rest parameters shown in Table 1 within the tolerances. FIG. 12A illustrates the simulated TDR waveforms of 100 Good Units and 100 Fail Units, for the purposes of example. From the example in FIG. 12A, the differences between the waveforms for Good Units and the waveforms for Fail Units can be observed with relative clarity. To address such kind of issues in the detection of marginal Fail Units, embodiments are most applicable.

In embodiments, a time window may be identified for a relevant time window. Since defect locations may be unknown, the relevant time window should cover a full reflection range from the probing location to the device point, in accordance with embodiments. As an example, based on the parameters shown in Table 1, the actual device point may be approximately 50 ps. However, in some examples, a reflection from the device point may return to zero at a significantly later at around 250 ps due to a slow discharging of $C_L$. As an example, a time window may be selected to be 0~130 ps, within which most of the significant reflections are included.

In embodiments, the TDR waveform features may be extracted through a cross-correlation method. Example FIG. 12A illustrates extracted features for all waveforms. Fail Units from the Good Units may be distinguishable. In embodiments, Hoteling's $T^2$-test may be applied to the extracted features of Good Units to obtain the circle of confidence interval (CI). CI circles serve as a good measure to detect a soft defect as the extracted features of Fail Units could possibly appear anywhere outside the CI circles, subjected to the TDR waveform of Good Units and a type of soft defect, in accordance with embodiments.

Figure 12B:
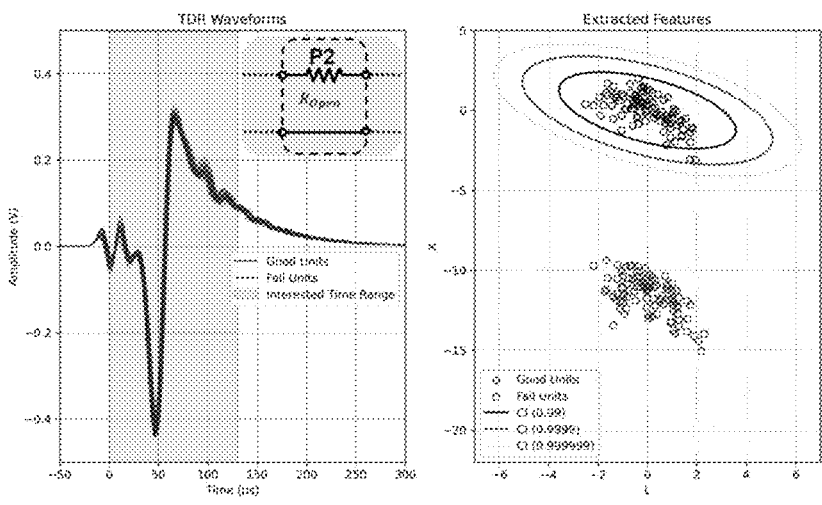

As an example, in embodiments, a resistive open defect may be placed at a P2 location of example FIG. 4 with a $R_{Open}$ of 1Ω. The TDR waveforms of Fail Units may be generated through another 100 samples (for example), generated with the rest of the parameters shown in Table 1 within the tolerances. Example FIG. 12B illustrates the generated TDR waveforms of Fail Units together with the waveforms of Good Units. As illustrated, waveforms of Fail Units and waveforms of Good Units almost overlap. A time window of 0~130 ps may applied for the outlier detection, as an example. Example FIG. 12B illustrates the extracted features for waveforms of Fail Units compared to waveforms of Good Units and CI circles, in accordance with embodiments. In embodiments, a 1–Ω resistive open may be detected even if the 1–Ω resistive open is located close to the device in the die. In embodiments, because the current allowed to flow through the device is very small, it may be challenging to detect a marginal resistive open in the chip package by functional tests alone.

Figure 12C:
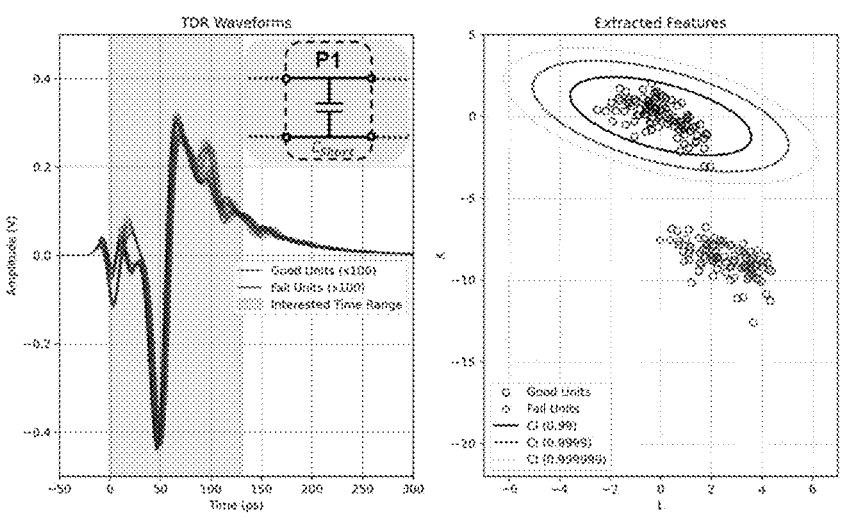

As an example, in embodiments, a capacitive short defect may be placed at a P1 location of example FIG. 4 with a $C_{Short}$ of 60 fF. The TDR waveforms of Fail Units may be generated through another 100 samples (for example) generated with the rest parameters shown in Table 1 within the tolerances, in accordance with embodiments. Example FIG. 12C illustrates the resulting waveforms, in accordance with embodiments. For example, the 60-fF short capacitances in Fail Units may reduce the impedance at P1 (of example FIG. 4), inducing lower reflections amplitude around 0 ps than those of Good Units. For example, such waveform differences may be carried forward in the existence of multiple reflections within the signal trace, leading to higher reflection amplitudes near 25 ps and 100 ps. These time slots exposed to waveform changes are covered by the selected time window of 0~130 ps, as an example. Example FIG. 12C illustrates extracted features for waveforms of Fail Units compared to waveforms of Good Units and CI circles, where all Fail Units are distinguished, in accordance with embodiments.

Figure 12D:
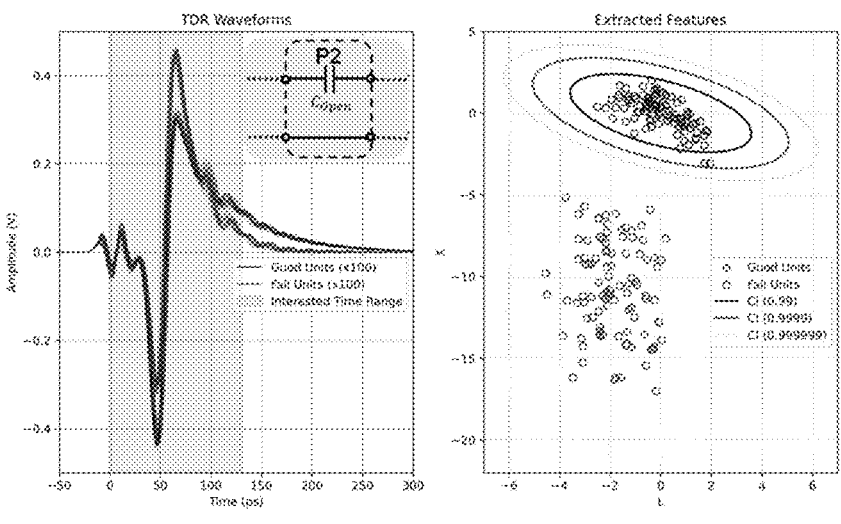

As an example, in embodiments, a capacitive open defect may be placed at a P2 location (of example FIG. 4) with a $C_{Open}$ of 1 pF. In this example, if stacking another capacitor above $C_L$. $C_L$ can still be charged above the threshold in this manner, which may cause such a failure to be ignored by a functional test. The TDR waveforms of Fail Units may be generated through 100 samples (for example) generated with the rest parameters shown in Table 1 within the tolerances. Example FIG. 12D illustrates the resulting waveforms, in accordance with embodiments. The waveforms for the Fail Units may be higher than the waveforms of the Good Units in 40~90 ps, as a result of the reduction of overall loading capacitance ($C_{Open}$ and $C_L$ are in series), in accordance with embodiments. A time window of 0~130 ps may be applied for the outlier detection, as an example. Example FIG. 12D illustrates extracted features for waveforms of Fail Units compared to waveforms of Good Units and CI circles, where the Fail Units are distinguished, in accordance with embodiments.

Example FIG. 13 illustrates a representation of a device under test waveform together with reference waveforms, in accordance with embodiments. Example FIG. 13 illustrates the measured EOS-TDR waveforms of Good Units and Fail Unit (fs), in accordance with embodiments. In this example, there are 22 Good Units and one Fail Unit.

Example FIG. 14 illustrates a visual representation of a Hoteling's T2-test statistical analysis of a device under test waveform of a device under test that fails to satisfy quality standards together with reference waveforms, in accordance with embodiments. Example FIG. 13 illustrates the Hoteling's $T^2$-test for the measured EOS-TDR waveforms, in accordance with embodiments. In this example, the Fail Unit may be detected with a confidence interval of 99.9995%, in accordance with embodiments.

Example FIG. 15 illustrates a computing device 1200, in accordance with embodiments. Computing device 1200 is only one example of a computing device and is not intended to suggest any limitation as to the scope of use or functionality of embodiments described herein. Regardless, computing device 1200 is capable of being implemented and/or performing any of the functionality set forth hereinabove. The term processing node is a logical concept. Any number of central processing units with any number of cores or machines can be in a computing device or spread among multiple computing devices.

In computing device 1200 there is a computer system/ server 1202, which is operational with numerous other general purpose or special purpose computing system environments or configurations. Examples of well-known computing systems, environments, and/or configurations that may be suitable for use with computer system/server 1202 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1202 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 1202 may be practiced in distributed cloud computing environments where tasks are performed by remote processing devices that are linked through a communications network. In a distributed cloud computing environment, program modules may be located in both local and remote computer system storage media including memory storage devices.

Embodiments relate to a non-transitory storage medium having stored thereon a program for causing at least one processor to perform a method. In embodiments, the method includes measuring a device under test using at least one time-domain reflectometry measurement of the device under test to generate a device under test waveform. In embodiments, the method includes comparing the device under test waveform with at least one reference waveform, wherein the at least one reference waveform represents at least one time-domain reflectometry measurement of at least one device that is known to satisfy quality standards. In embodiments, the method includes determining if the device under test satisfies quality standards based on the result of the comparing.

As shown in FIG. 15, computer system/server 1202 in computing device 1200 is shown in the form of a general-purpose computing device. The components of computer system/server 1202 may include, but are not limited to, one or more processors or processing units 1204, a system memory 1206, and a bus 1208 that couples various system components including system memory 1206 to processor 1204.

Bus 1208 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 1202 typically includes a variety of computer system readable media. Such media may be any available media that is accessible by computer system/server 1002, and it includes both volatile and non-volatile media, removable and non-removable media.

The system memory 1206 can include computer system readable media in the form of volatile memory, such as random access memory (RAM) 1210 and/or cache memory 1212. Computer system/server 1202 may further include other removable/non-removable, volatile/non-volatile computer system storage media. By way of example only, storage system 1214 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1208 by one or more data media interfaces. As will be further depicted and described below, memory 1206 may include at least one program product having a set (e.g., at least one) of program modules that are configured to carry out the functions of various embodiments of the invention.

Program/utility 1216, having a set (at least one) of program modules 1218, may be stored in memory 1206 by way of example, and not limitation, as well as an operating system, one or more application programs, other program modules, and program data. Each of the operating system, one or more application programs, other program modules, and program data or some combination thereof, may include an implementation of a networking environment. Program modules 1218 generally carry out the functions and/or methodologies of various embodiments of the invention as described herein.

Computer system/server 1202 may also communicate with one or more external devices 1020 such as a keyboard, a pointing device, a display 1222, etc.; one or more devices that enable a user to interact with computer system/server 1202; and/or any devices (e.g., network card, modem, etc.)

that enable computer system/server 1202 to communicate with one or more other computing devices. Such communication can occur via I/O interfaces 1224. Still yet, computer system/server 1202 can communicate with one or more networks such as a local area network (LAN), a general wide area network (WAN), and/or a public network (e.g., the Internet) via network adapter 1226. As depicted, network adapter 1226 communicates with the other components of computer system/server 1202 via bus 1208. It should be understood that although not shown, other hardware and/or software components could be used in conjunction with computer system/server 1202. Examples, include, but are not limited to: microcode, device drivers, redundant processing units, external disk drive arrays, RAID systems, tape drives, and data archival storage systems, etc.

Example FIG. 16 illustrates cloud computing environment 1302, in accordance with embodiments. As shown, cloud computing environment 1302 comprises one or more cloud computing nodes 1200 with which local computing devices used by cloud consumers, such as, for example, personal digital assistant (PDA) or cellular telephone 1304, desktop computer 1306, laptop computer 1308, and/or automobile computer system 1310 may communicate. Nodes 1200 may communicate with one another. They may be grouped (not shown) physically or virtually, in one or more networks, such as Private, Community, Public, or Hybrid clouds as described hereinabove, or a combination thereof. This allows cloud computing environment 1302 to offer infrastructure, platforms and/or software as services for which a cloud consumer does not need to maintain resources on a local computing device. It is understood that the types of computing devices 1304, 1306, 1308, 1310 shown in FIG. 16 are intended to be illustrative only and that computing nodes 1200 and cloud computing environment 1302 can communicate with any type of computerized device over any type of network and/or network addressable connection (e.g., using a web browser).

Example FIG. 17 illustrates a set of functional abstraction layers provided by cloud computing environment 1302 (FIG. 16), in accordance with embodiments. It should be understood in advance that the components, layers, and functions shown in FIG. 17 are intended to be illustrative only and embodiments are not limited thereto. As depicted, the following layers and corresponding functions are provided:

Hardware and software layer 1402 includes hardware and software components. Examples of hardware components include mainframes; RISC (Reduced Instruction Set Computer) architecture based servers; storage devices; networks and networking components. Examples of software components include network application server software and database software.

Virtualization layer 1404 provides an abstraction layer from which the following examples of virtual entities may be provided: virtual servers; virtual storage; virtual networks, including virtual private networks; virtual applications and operating systems; and virtual clients. In one example, management layer 1406 may provide the functions of processing unit 68. Workloads layer 1408 provides examples of functionality for which the cloud computing environment may be utilized.

Aspects of the present invention have been discussed above with reference to flowchart illustrations and/or block diagrams of methods, apparatus (systems) and computer program products according to various embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium to measure a device under test (DUT) and determine if the DUT satisfies quality standards including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It will be obvious and apparent to those skilled in the art that various modifications and variations can be made in the embodiments disclosed. This, it is intended that the disclosed embodiments cover the obvious and apparent modifications and variations, provided that they are within the scope of the appended claims and their equivalents.

What is claimed is:

1. A method comprising:
   measuring a device under test using at least one time-domain reflectometry measurement of the device under test to generate a device under test waveform;
   comparing, using at least one processor, the device under test waveform with at least one reference waveform, wherein the at least one reference waveform represents at least one time-domain reflectometry measurement of at least one device that is known to satisfy quality standards; and
   determining, using the at least one processor, if the device under test satisfies quality standards based on the result of the comparing.

2. The method of claim 1, wherein:
   the at least one time-domain reflectometry measurement of the device under test is at least one electro-optic sampling based time-domain reflectometry measurement of the device under test; and
   the at least one time-domain reflectometry measurement of the at least one device that is known to satisfy quality standards is at least one electro-optic sampling based time-domain reflectometry measurement of the at least one device that is known to satisfy quality standards.

3. The method of claim 1, wherein:
   the at least one device that is known to satisfy quality standards is a plurality of devices that are known to satisfy quality standards, wherein each of the plurality of devices that are known to satisfy quality standards has an associated reference waveform of the at least one reference waveform; and
   the method comprises generating an average reference waveform by averaging all the associated reference waveforms of all the plurality of devices that are known to satisfy quality standards.

4. The method of claim 3, wherein the at least one reference waveform and the average reference waveform are stored in a reference waveform database.

5. The method of claim 3, wherein:
   each of the associated reference waveforms are time frame windowed to a relevant time range prior to the generating the average reference waveform; and
   the device under test waveform is time frame windowed to the relevant time range prior to the comparing the device under test waveform with the associated reference waveforms.

6. The method of claim 5, wherein the relevant time range of the device under test waveform and the associated reference waveforms is selected to include at least one peak feature of at least one of the associated reference waveforms.

7. The method of claim 3, wherein the comparing comprises:
   cross-correlating of the average reference waveform with each of the associated reference waveforms to generate at least one cross-correlation of the associated reference waveforms; and
   cross-correlating of the average reference waveform with the device under test waveform to generate a cross-correlation of the device under test waveform.

8. The method of claim 7, wherein the comparing comprises:
   extracting at least one peak feature from the at least one cross-correlation of the associated reference waveforms; and
   extracting at least one peak feature from the cross-correlation of the device under test waveform.

9. The method of claim 8, wherein:
   the at least one peak feature from the at least one cross-correlation of the associated reference waveforms comprises at least one of an amplitude peak feature of the associated reference waveforms or at least one lag peak feature of the associated reference waveforms;
   the at least one peak feature from the cross-correlation of the device under test waveform comprises at least one of an amplitude peak feature of the device under test waveform or a lag peak feature of the device under test waveform.

10. The method of claim 9, wherein:
   the comparing comprises comparing the at least one peak feature extracted from the cross-correlation of the device under test waveform with the at least one peak feature extracted from the cross-correlation of the associated reference waveforms; and
   a significant deviation of the lag peak feature of the device under test waveform compared to the lag peak features of the associated reference waveforms is indicative of a capacitive defect of the device under test.

11. The method of claim 9, wherein:
   the comparing comprises comparing the at least one peak feature extracted from the cross-correlation of the device under test waveform with the at least one peak feature extracted from the cross-correlation of the associated reference waveforms; and
   a significant deviation of the amplitude peak feature of the device under test waveform compared to the amplitude peak features of the associated reference waveforms is indicative of a resistive defect of the device under test.

12. The method of claim 8, wherein the comparing comprises comparing the at least one peak feature extracted from the cross-correlation of the device under test waveform with the at least one peak feature extracted from the cross-correlation of the associated reference waveforms.

13. The method of claim 12, wherein the determining comprises determining that the device under test does not satisfy quality standards if it is determined that there is a significant deviation of the at least one peak feature extracted from the cross-correlation of the device under test waveform with the at least one peak feature extracted from the cross-correlation of the associated reference waveforms.

14. The method of claim 13, wherein it is determined that there is the significant deviation according to statistical analysis of the at least one peak feature extracted from the cross-correlation of the device under test waveform and the at least one peak feature extracted from the cross-correlation of the associated reference waveforms.

15. The method of claim 14, wherein the statistical analysis comprises Hotelling t-squared statistical analysis.

16. The method of claim 14, wherein the statistical analysis is performed by at least one of artificial intelligence, machine learning, or a statistical algorithm.

17. The method of claim 1, wherein:

the device under test is a computing chip;

the quality standards relate to the quality of the wiring in a substrate between a solder ball and a die of the computing chip; and the determining if the device under test satisfies quality standards determines if there are soft defects in the computing chip that cannot be detected by functional testing.

18. The method of claim 1, wherein the quality standards relate to at least one of soft defects and hard defects.

19. An apparatus comprising:

at least one processor; and a measuring device that measures a device under test using at least one time-domain reflectometry measurement of the device under test to generate a device under test waveform, wherein the at least one processor compares the device under test waveform with at least one reference waveform, wherein the at least one reference waveform represents at least one time-domain reflectometry measurement of at least one device that is known to satisfy quality standards, and wherein the at least one processor determines if the device under test satisfies quality standards based on the result of the comparing the device under test waveform with the at least one reference waveform.

20. A non-transitory storage medium having stored thereon a program for causing at least one processor to perform:

measuring, under direction of the at least one processor, a device under test using at least one time-domain reflectometry measurement of the device under test to generate a device under test waveform;

comparing, using the at least one processor, the device under test waveform with at least one reference waveform, wherein the at least one reference waveform represents at least one time-domain reflectometry measurement of at least one device that is known to satisfy quality standards; and determining, using the at least one processor, if the device under test satisfies quality standards based on the result of the comparing.

\* \* \* \* \*